US006266800B1

(12) United States Patent
Uhlmann et al.

(10) Patent No.: US 6,266,800 B1
(45) Date of Patent: *Jul. 24, 2001

(54) SYSTEM AND METHOD FOR ELIMINATING EFFECTS OF PARASITIC BIPOLAR TRANSISTOR ACTION IN DYNAMIC LOGIC USING SETUP TIME DETERMINATION

(75) Inventors: Gregory John Uhlmann; Salvatore N. Storino, both of Rochester, MN (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/239,290

(22) Filed: Jan. 29, 1999

(51) Int. Cl.[7] ............... G06F 17/50; H03K 19/0175; H03K 19/20; H03K 17/16
(52) U.S. Cl. .................. 716/6; 716/2; 326/89; 326/124; 327/382; 327/391
(58) Field of Search .......... 395/500.07, 500.01–500.19; 716/6

(56) References Cited

U.S. PATENT DOCUMENTS

| 4,780,626 | | 10/1988 | Guerin et al. ............ 307/448 |
| 4,808,840 | * | 2/1989 | Chung et al. ............ 307/290 |
| 4,950,925 | * | 8/1990 | Doi et al. ............... 307/446 |
| 5,015,882 | * | 5/1991 | Houston et al. .......... 307/452 |
| 5,051,620 | | 9/1991 | Bergin ................... 307/452 |
| 5,144,163 | * | 9/1992 | Matsuzawa et al. ....... 307/446 |
| 5,266,848 | * | 11/1993 | Nakagome et al. ........ 307/475 |
| 5,359,535 | * | 10/1994 | Djaja et al. ............ 364/489 |
| 5,535,133 | * | 7/1996 | Petschauer et al. ....... 364/489 |
| 5,655,109 | * | 8/1997 | Hamid ................... 395/500 |
| 5,764,089 | * | 6/1998 | Partovi et al. .......... 327/200 |
| 5,767,549 | * | 6/1998 | Chen et al. ............. 257/347 |
| 5,815,005 | * | 9/1998 | Bosshart ................ 326/95 |
| 5,821,778 | * | 10/1998 | Bosshart ................ 326/95 |
| 5,831,451 | * | 11/1998 | Bosshart ................ 326/93 |

OTHER PUBLICATIONS

Chin et al., Parasitic Bipolar Turn–on of PD–SOI MOSFETs in Dynamic Logic Circuits, Proceedings 1996 IEEE International SOI Conference, pp. 144–145, Oct. 1996.*
Assaderaghi et al. History Dependence of Non–Fully Depleted (NFD) Digital SOI Circuits, 1996 Symposium of VLSI Technology Digest of Technical Papers, pp. 122–123, Jun. 1996.*
IBM Research Disclosure, Pre–Discharge Technique to Improve Noise Immunity on Silicon–on–Insulator (SOI) Domino Circuits, Apr. 1998, pp. 496–497.

* cited by examiner

Primary Examiner—Matthew Smith
Assistant Examiner—A. M. Thompson
(74) Attorney, Agent, or Firm—Merchant & Gould

(57) ABSTRACT

A method and apparatus of eliminating the unwanted effects of parasitic bipolar discharge in dynamic logic circuits including silicon-on-insulator (SOI) field effect transistors (FET) by measuring setup time in a logic partition of a dynamic logic circuit having a precharging device and an output device. The method determines a first time delay of a clock signal from said logic partition to a control input of said precharging device and a second time delay of a logic signal from said logic partition to a control input of said output device. The method then determines a setup time according to said first and second time delays. The precharging device remains active during the setup time to prevent parasitic bipolar discharge.

16 Claims, 7 Drawing Sheets

SYSTEM AND METHOD FOR ELIMINATING EFFECTS OF PARASITIC BIPOLAR TRANSISTOR ACTION IN DYNAMIC LOGIC USING SETUP TIME DETERMINATION

BACKGROUND OF THE INVENTION

A. Field of the Invention

The invention relates generally to a method and apparatus for measuring setup time in dynamic logic circuits. More specifically, the invention relates to a method and apparatus of measuring setup up time of SOI field effect transistors (FET) in dynamic logic circuits.

B. Description of Related Art

Silicon-on-insulator (SOI) technology is an enhanced silicon technology currently being utilized to increase the performance of digital logic circuits. Utilizing SOI technology designers can increase the speed of digital logic integrated circuits while reducing their overall power consumption. These advances in technology will lead to the development of more complex and faster computer integrated circuits that operate with less power.

In recent years Metal Oxide Semiconductor (MOS) Field Effect Transistor (FET) integrated circuits and Complementary Metal Oxide Semiconductor (CMOS) FETs have gained popularity and are the most widely used type of integrated circuit technology. Today, CMOS electronic devices provide advantages of higher operating speeds, smaller size, lower power consumption, and are increasingly becoming cheaper to manufacture as a result of smaller component size, higher manufacturing production yields per semiconductor wafer, and larger wafer sizes. The most popular integrated circuit devices manufactured utilizing CMOS technology are microprocessors, memory, and digital logic circuits.

Traditional MOS and CMOS semiconductors consist of a metal on an oxide layer that is placed on a silicon substrate. The added impurities in the silicon substrate enable these devices to operate as transistors. On the other hand, SOI semiconductors include a thin layer of silicon placed on top of an insulator, such as silicon oxide or glass, and a MOS transistor built on top of this structure. The main advantage of constructing the MOS transistor on top of an insulator layer is to reduce the internal capacitance of the transistor. This is accomplished by placing the insulator oxide layer between the silicon substrate and the impurities required for the device to operate as a transistor. Reducing the internal capacitance of the transistor increases its operating speed. Therefore, with SOI technology faster MOS transistors can be manufactured resulting in higher performance semiconductors to fuel emerging needs for faster electronic devices.

SOI technology has several drawbacks. An inherent drawback of placing a MOS transistor on top of a SOI layer is that the MOS transistor is actually placed in parallel with a bipolar junction transistor. If enough current is passed through the MOS transistor, the parasitic bipolar transistor will turn on. This causes an unwanted effect called bipolar discharge and lowers the performance of the MOS transistor.

High speed CMOS circuits often employ a domino circuit technique that utilizes pre-charging to improve the gate speeds of the transistors. Circuit nodes are pre-charged during each clock cycle to a certain level. The problem with SOI FETs is that the parasitic bipolar transistor causes bipolar discharge. This is undesirable because it causes an unintended loss of charge on the drain nodes of the dynamic circuit.

Normally, parasitic bipolar action does not manifest itself in conventional, bulk, MOS transistors because the base of the bipolar transistor is always kept at ground potential, keeping the bipolar off. In SOI, the body of the MOS FET device, or base of the bipolar transistor, is floating and can be charged high by junction leakages induced when the drain and source terminals of the MOS FET are at a high potential. Subsequently, if the source is pulled to a low potential, the trapped charge in the base area is available as parasitic base current. The parasitic base current activates the bipolar transistor and generates a collector current at the drain terminal of the MOS FET. The unintentional loss of charge could lead to system failure, for example, by erroneously switching logic state.

It will be appreciated by those skilled in the art that a technique for eliminating parasitic bipolar discharge in MOS FET devices can be provided as discussed in U.S. patent application Ser. No. 09/240,244, filed Jan. 29, 1999, and entitled "Method And Apparatus For Elimination Of Parasitic Bipolar Action In Complementary Oxide Semiconductor (CMOS) Silicon On Insulator (SOI) Circuits," the disclosure of which is hereby incorporated herein by reference.

It will also be appreciated by those skilled in the art that a technique for eliminating parasitic bipolar discharge in logic circuits including CMOS SOI devices can be provided as discussed in U.S. patent application Ser. No. 09/239,991, filed Jan. 29, 1999 and entitled "Method And Apparatus For Elimination Of Parasitic Bipolar Action In Logic Circuits Including Complementary Oxide Semiconductor (CMOS) Silicon On Insulator (SOI) Elements," the disclosure of which is also hereby incorporated herein by reference.

It will also be appreciated by those by those skilled in the art that yet another technique for eliminating parasitic bipolar discharge in logic circuits including CMOS SOI devices can be provided as discussed in U.S. patent application Ser. No. 09/239,289, filed Jan. 29, 1999 and entitled "Method And Apparatus For Elimination Of Parasitic Bipolar Action In Logic Circuits For History Removal Under Stack Contention Including Complementary Oxide Semiconductor (CMOS) Silicon On Insulator (SOI) Elements," the disclosure of which is also hereby incorporated herein by reference.

Dynamic Logic circuits utilize a "setup" time for the various logic inputs. "Setup" time is generally defined as the time within which an input data signal should be provided to an input of a logic circuit to guarantee the stability of the logic circuit's output. It will be appreciated that the output of the logic circuit should be stable prior to a subsequent clock signal arriving at the clock input of a dynamic logic circuit. Accordingly, the output stability of the circuit cannot be guaranteed if the input signal does not arrive at the circuit's input prior to the clock signal. The time within which the input data signal must "beat" the clock signal is referred to as the "setup" time.

In CMOS Dynamic Logic circuits that do not employ SOI technology, "setup" is a delay time defined as the difference between the time required by the input data signal to propagate from the circuit data input to a point where it coincides with the clock signal; and the time required by the clock signal to propagate from the circuit clock input to a point where it coincides with the data input signal.

FIG. 3 is a schematic of a dynamic logic circuit illustrating a method for measuring data setup time that is well known in the art. Dynamic logic circuit 44, within logic partition 46, includes a clock signal input (CLK) and a data signal input (DATA). The DATA input is fed to an arbitrary logic circuit 56 (LOGIC). The DATA signal propagates from the DATA input of logic partition 46 to the gate input 52 (Test_Node) of negative field effect transistor (NFET) 62.

The time delay along data signal path 48, from the DATA signal input to the gate input 52 of NFET device 62 is D1. The time delay along clock signal path 50, from the CLK signal input to the gate input 54 (LClk_e) of NFET evaluate device 60 is D2. The setup time, SETUP, for the dynamic circuit 44 is defined by the equation at TABLE 1 as the difference between time delays D1 and D2, along signal paths 48 and 50, respectively, as:

TABLE 1

SETUP=D1−D2

However, those skilled in the art will appreciate that in dynamic logic circuits, timing tools such as PATHMILL and EINSTIMER (for example), measure the time delay D2 along clock signal path 50 to the gate input 54 of evaluate transistor 60.

In CMOS Dynamic Logic circuits employing SOI technology, it is preferable that the time delay should be measured along the CLK signal to the gate input 66 (LClk_p) of precharging transistor 58. In SOI technology, a bipolar leakage path may exist through the stack of NFET transistors 60 and 62 during the evaluate phase of dynamic logic circuit 44. The bipolar leakage can cause the dynamic logic circuit output 64 to produce an incorrect logic value. Those skilled in the art will appreciate that the bipolar leakage will not occur whenever evaluate transistor 60 is located between NFET 62 and circuit common 68. However, it is well known in the art to place the evaluate transistor 60 between the NFET 62 and the precharging transistor 58 for implementing charge sharing techniques or to enhance the performance of the dynamic circuit.

It will also be appreciated by those skilled in the art that for other performance enhancement reasons, the evaluate transistor 60 may be eliminated from the circuit altogether. In this case, bipolar leakage may occur based on the state of the logic inputs.

As a result, it can be seen that there is a need for a method of measuring "setup" test time in Dynamic CMOS SOI logic circuits to guarantee stability of the circuit's output.

SUMMARY OF THE INVENTION

In one embodiment the present invention relates generally to a method of eliminating the effects of parasitic bipolar transistor action by measuring a setup time in a logic partition of a dynamic logic circuit including Silicon on Insulator(SOI) Metal Oxide Semiconductor (MOS) devices, having a precharging device and an output device, the method comprising: determining a first time delay of a first signal from said logic partition to a control input of said precharging device; determining a second time delay of a second signal from said logic partition to a control input of said output device; and determining a setup time according to said first and second time delays.

In another embodiment the present invention relates generally to an apparatus for eliminating the effects of parasitic bipolar transistor action in dynamic logic circuits including Silicon on Insulator(SOI) Metal Oxide Semiconductor (MOS) devices, comprising: a first logic circuit; a second logic circuit; a precharging device coupled to said first logic circuit; a output device coupled to said second logic circuit; and said precharging device coupled to said output device defining a node therebetween; wherein a setup time is determined according to a determined timing relationship between a first signal propagation time through said first logic circuit and a second signal propagation time through said second logic circuit.

These and various other features and advantages of the present invention will become readily apparent to those skilled in the art from the following detailed description and corresponding drawings. As will be realized, the invention is capable of modification without departing from the invention. Accordingly, the drawing and description are to be regarded as being illustrative in nature, and not as restrictive.

DETAILED DESCRIPTION OF THE ILLUSTRATED EMBODIMENTS

The illustrated embodiment is directed at reducing or eliminating the unwanted effects of the parasitic bipolar transistor in silicon-on-insulator (SOI) field effect transistor (FET) dynamic logic circuits.

Figure 1:
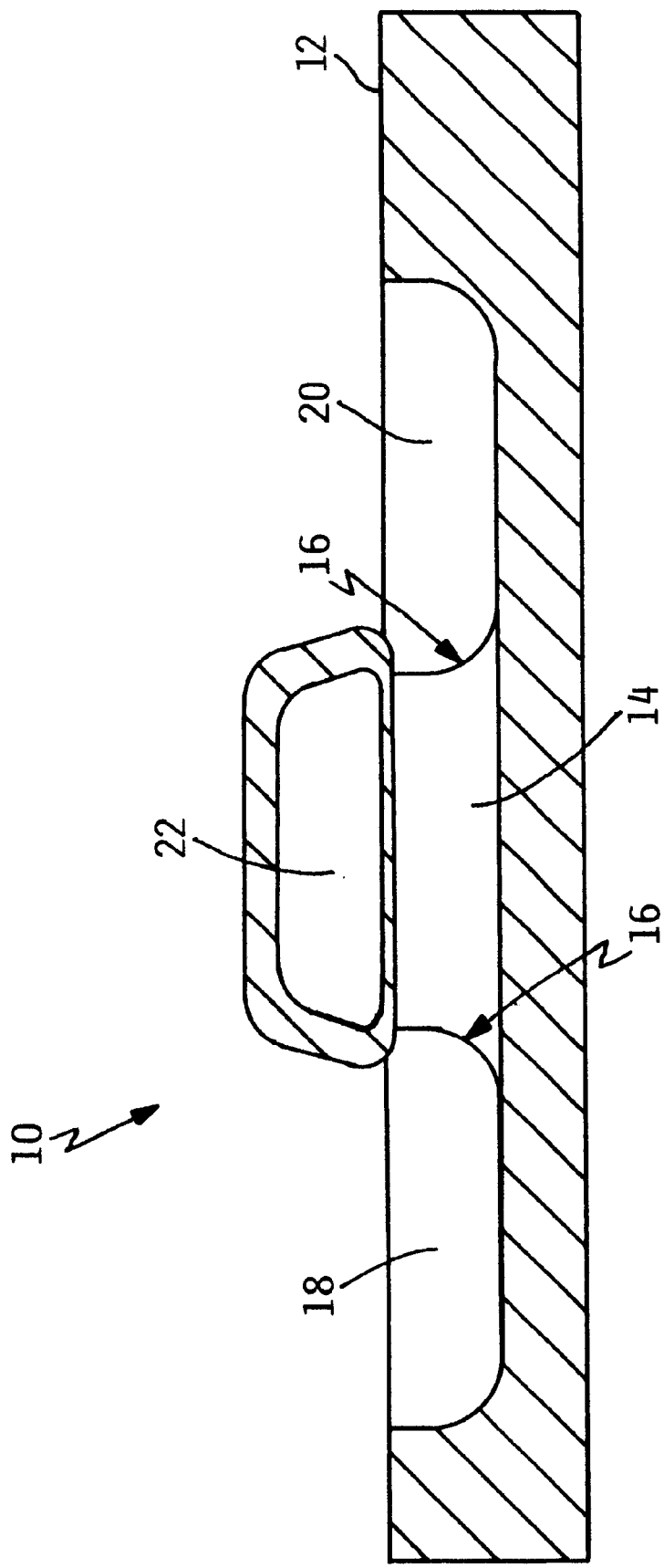
FIG. 1 is a cross sectional diagram of a silicon-on-insulator (SOI) field effect transistor (FET) and a parasitic bipolar transistor.

FIG. 1 illustrates a cross sectional view of a silicon-on-insulator (SOI) negative field effect transistor (NFET) 10 and a parasitic bipolar transistor. The NFET 10 is built on an insulator 12, e.g. of silicon dioxide, i.e. glass. In bulk (non SOI) the base region of the parasitic bipolar transistor is always maintained at ground potential. Therefore, no base current is generated and no resulting collector current flows through the bipolar device. However, in SOI transistors, the body of the FET device 14, or base region of the parasitic bipolar transistor, which lies beneath the gate 21 of the NFET, is floating. The body 14 of the transistor can become charged to a high potential by junction 16 leakage induced whenever both the drain 18 and source 20 terminals are at a high potential. In this illustration the drain 18 of the NFET is the n+ or collector region of the parasitic bipolar and the source 20 is the n+ or emitter region of the parasitic bipolar.

If the body 14 of the FET charges to a high potential and the source 20 is pulled to a low potential, the trapped charge in the body 14, or base region, becomes available as parasitic base current. If the parasitic base current is of sufficient magnitude it will activate the parasitic bipolar transistor and thus generate a collector current at the drain 18. The collector current, flowing in parallel with the drain 18 current, is undesirable as it causes a loss of charge at the drain 18 node of the dynamic circuit.

Figure 2:
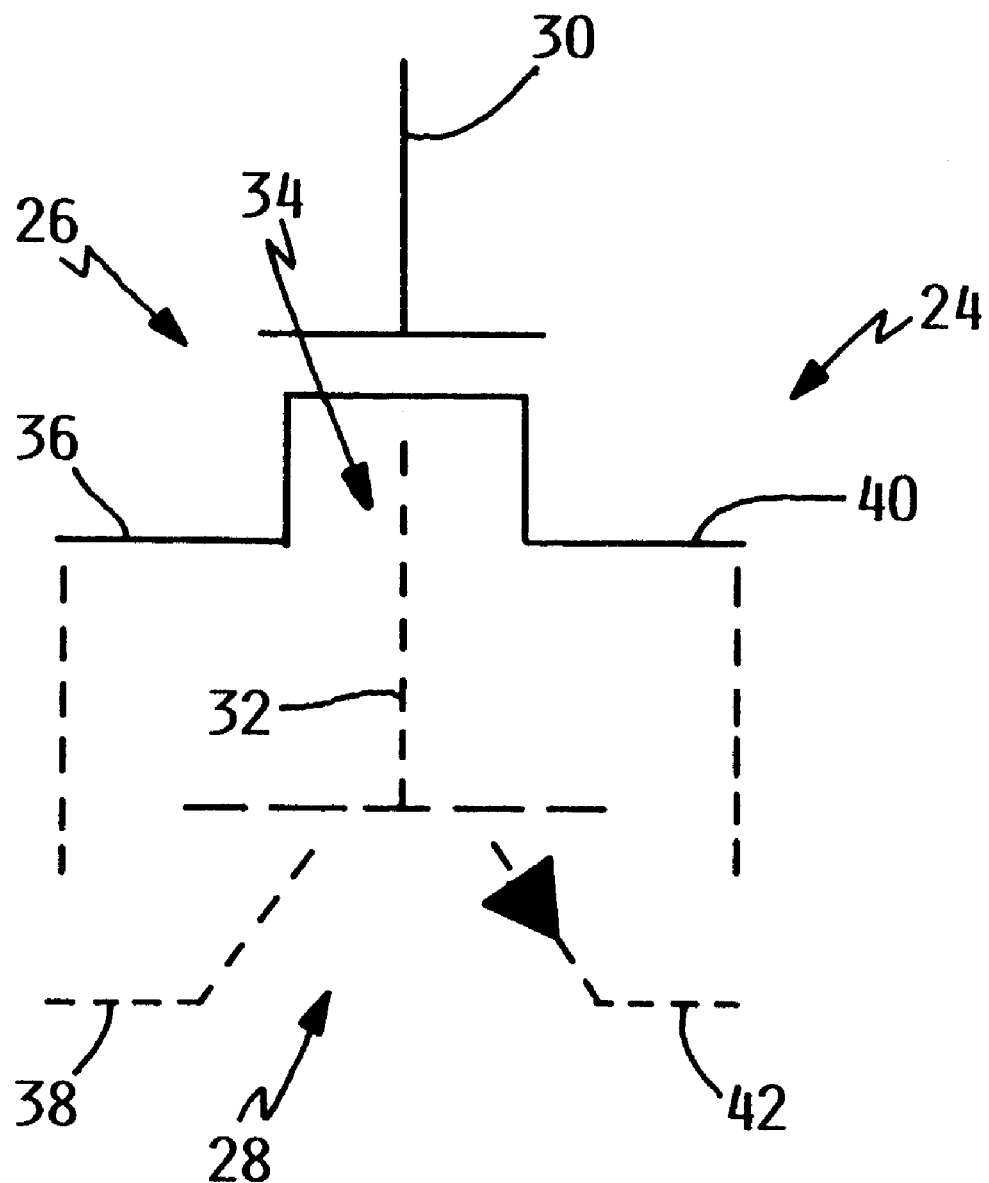
FIG. 2 is an equivalent schematic diagram of the SOI field effect transistor FET and bipolar transistor.
Figure 3:
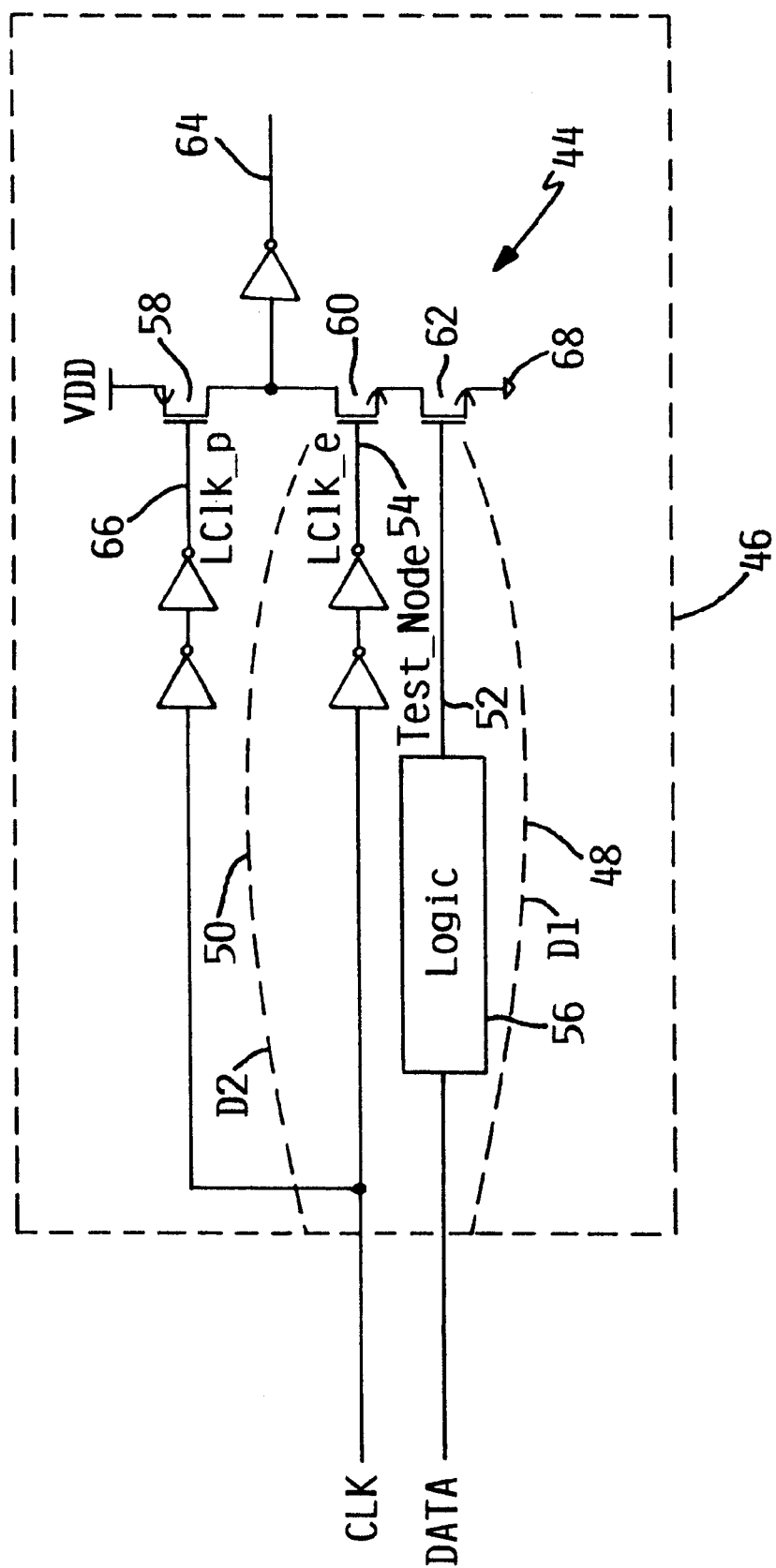
FIG. 3 is a schematic illustrating a method and apparatus for measuring data setup time delay in a dynamic logic circuit.

FIG. 2 illustrates an equivalent schematic diagram 24 of the SOI field effect transistor NFET 26 and the parallel parasitic bipolar NPN transistor 28. The gate terminal 30 of NFET 26 is equivalent to the base terminal 32 of the parasitic bipolar transistor 28 and is located at the body 34 of NFET 26. The drain 36 of NFET 26 is equivalent to the collector 38 of the parasitic bipolar transistor 28.

Accordingly, the source 40 of NFET 26 is equivalent to the emitter 42 of the parasitic bipolar transistor 28. The body 34 of NFET 26 becomes charged by induced leakage whenever the drain 36 and source 40 terminals are held at a high potential. If the source 40 is dropped to a low potential the trapped charged in the body 34 causes a current to flow from the base 32 of the parasitic bipolar transistor 28. This causes a current to flow in the collector 38 that is parallel to a current flowing in the drain 36. This action discharges the drain 36 node of a dynamic circuit.

Figure 4:
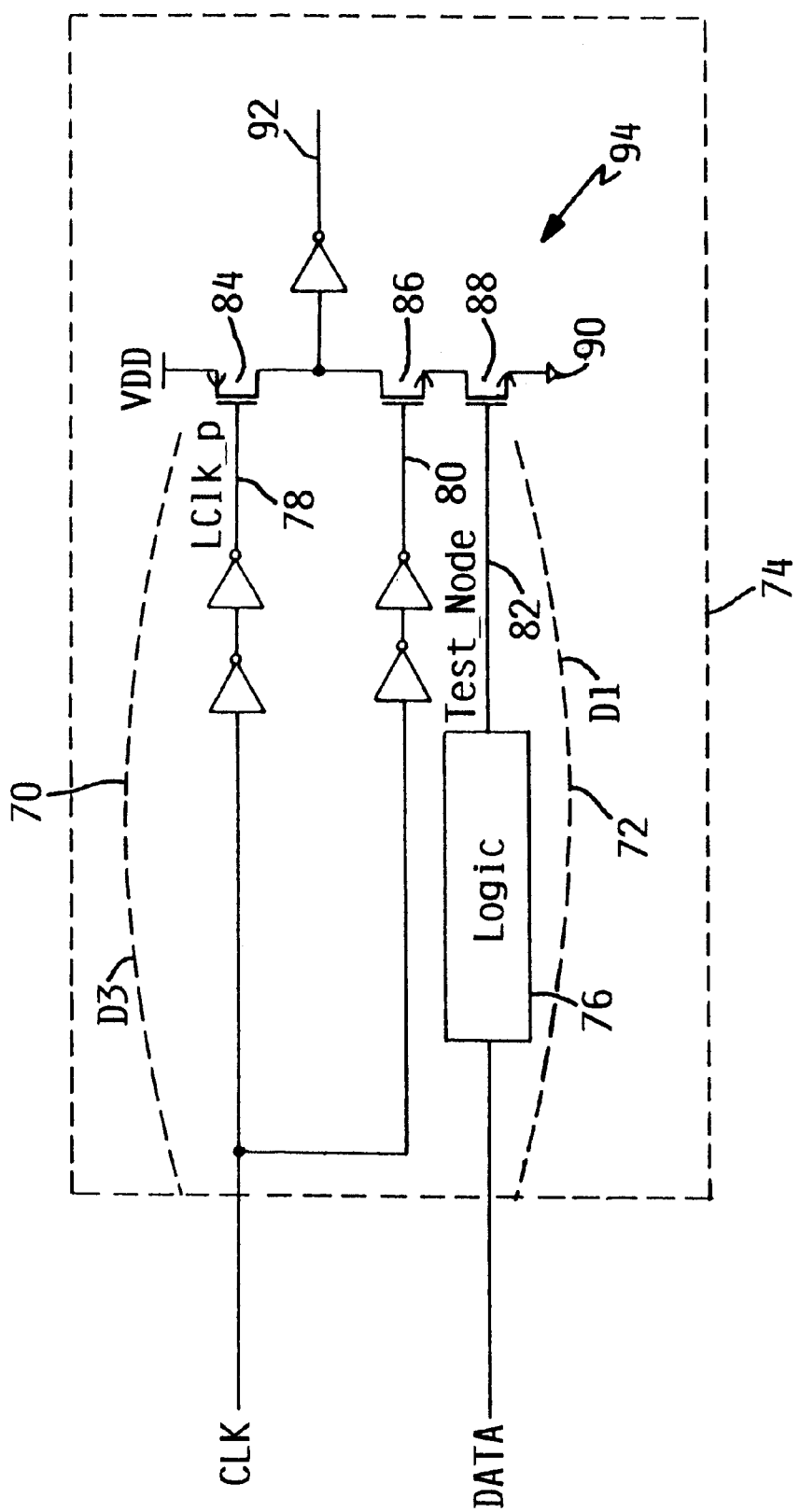
FIG. 4 is a schematic illustrating a method and apparatus for measuring data setup time delay in a SOI CMOS dynamic logic circuit having an evaluate device.

Referring now to FIG. 4, a schematic illustrating a method and apparatus for measuring data setup time is illustrated, including a dynamic logic circuit 94 within a logic partition 74, a clock signal input (CLK) and a data signal input (DATA). DATA input is fed to an arbitrary logic circuit 76 (LOGIC). The DATA signal propagates from the DATA input at logic partition 74 through LOGIC 76 to gate input 82 (Test_Node) of negative field effect transistor (NFET) 88.

The time delay along data signal path 72, from the DATA signal input to the gate input 82 of NFET transistor 88 is D1. The time delay along clock signal path 70, from the CLK signal input to gate input 78 (LClk_p) of NFET precharging transistor 84 is D3. The setup time, SETUP, for the dynamic circuit 94 is defined by the equation at TABLE 2 as the difference between time delays D1 and D3 along paths 72 and 70, respectively, as follows:

TABLE 2

SETUP=D1−D3

Those skilled in the art will appreciate that for the CMOS Dynamic Logic circuit 94 employing SOI technology, the time delay of the CLK signal to the gate input 78 (LClk_p) of precharging transistor 84 is a more desired time value to be measured. In SOI technology, a bipolar leakage path can exist through the stack of NFET transistors 86 and 88 during the evaluate phase of the dynamic logic circuit 94. Bipolar leakage can cause the dynamic logic circuit output 92 to produce an incorrect logic value. Those skilled in the art will appreciate that bipolar leakage will not occur whenever evaluate transistor 86 is located between NFET 88 and circuit common 90. However, it is well known in the art to place evaluate transistor 86 between an NFET transistor 88, for example, and the precharging transistor 84. This configuration is used for implementing charge sharing techniques or to enhanced the performance of the dynamic circuit.

When the setup time defined by the equation in TABLE 2: "SETUP=D1−D3," is used, bipolar leakage current will not flow through stacked NFETs 86 and 88 during the evaluate phase of the dynamic circuit 94 because the data signal is guaranteed to be stable before the precharging transistor 84 turns off. It will be appreciated by those skilled in the art, that while precharging transistor 84 is still on, the precharging action prevents bipolar leakage current from flowing through stacked NFETs 86 and 88. Accordingly, if the data signal is stable before precharging transistor 84 turns off, no bipolar leakage current will flow through stacked NFET transistors 86 and 88.

It will also be appreciated by those skilled in the art that the evaluate transistor 86 may be eliminated from the circuit. In this case, bipolar leakage may occur based on the state of the logic inputs.

Figure 5:
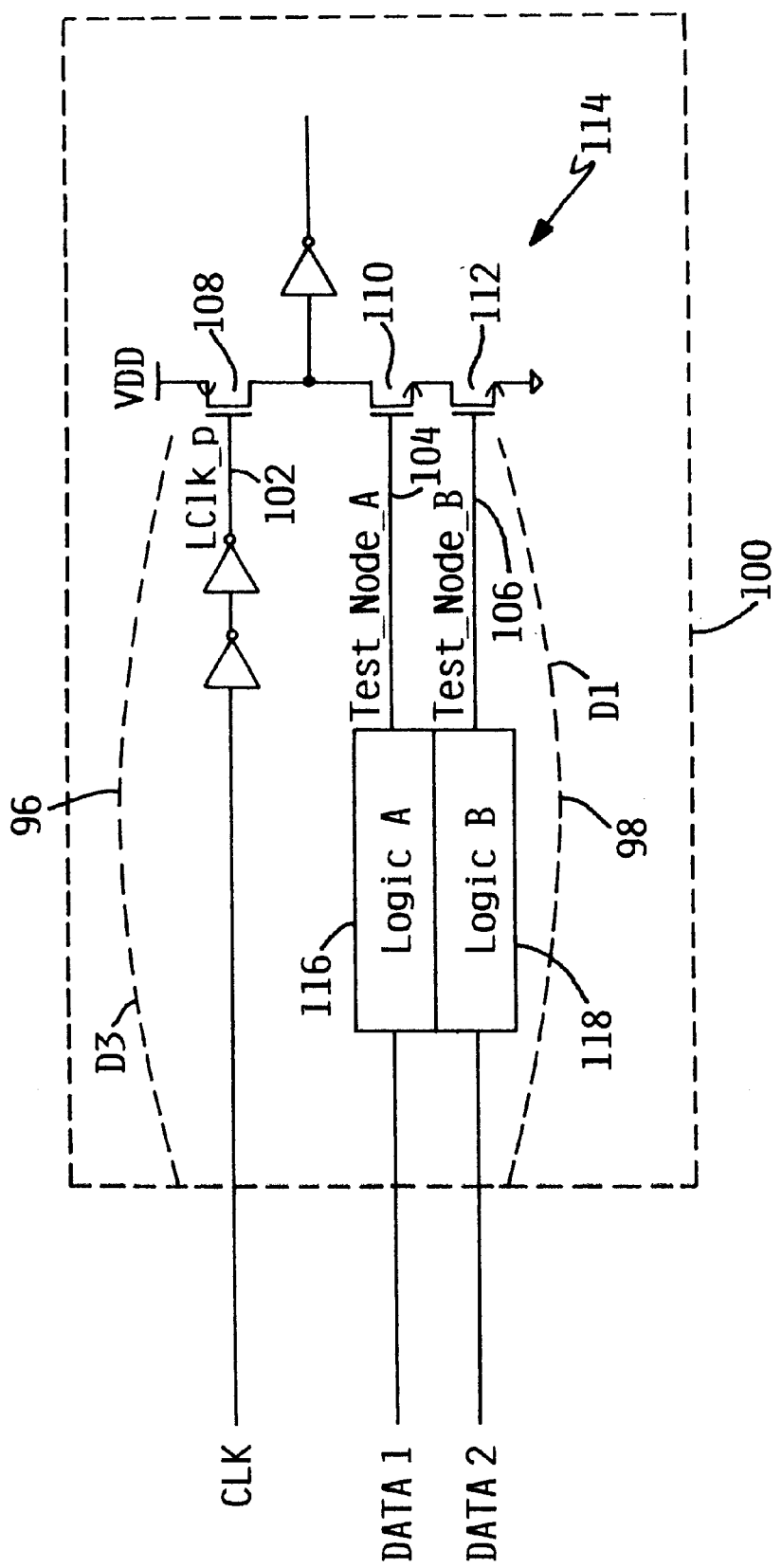
FIG. 5 is a schematic illustrating a method and apparatus for measuring data setup time delay in a SOI CMOS dynamic logic circuit without an evaluate device.

Referring now to FIG. 5, a schematic illustrating a method and apparatus for measuring data setup time in a dynamic logic circuit without an evaluate transistor includes a dynamic logic circuit 114 within logic partition 100, a clock signal input (CLK), a first data signal input (DATA1), and a second data signal input (DATA2). DATA1 input is fed to an arbitrary logic circuit 116 (LOGIC A). DATA2 input is fed to an arbitrary logic circuit 118 (LOGIC B). Data signals propagate from the DATA1 input of logic partition 100, through logic circuit 116, and to gate input 104 (Test_Node_A) of negative field effect transistor (NFET) 110. DATA2 input is fed to an arbitrary logic circuit 118 (LOGIC B). Data signals propagate from the DATA2 input of logic partition 100, through LOGIC B 118, and to gate input 106 (Test_Node_B) of negative field effect transistor (NFET) 112.

The time delay along data signal path 98, from either DATA1 or DATA2 signal inputs to the gate input 106 of NFET transistor 112 is D1. The time delay along clock signal path 96, from the CLK signal input to gate input 102 (LClk_p) of PFET precharging transistor 108 is D3. The setup time, SETUP, for the dynamic circuit is defined by the equation at TABLE 3 as the difference between time delays D1 and D3 along paths 98 and 96, respectively, as follows:

TABLE 3

SETUP=D1−D3

Those skilled in the art will appreciate that for the CMOS Dynamic Logic circuit 114 employing SOI technology, the time delay of the CLK signal to the gate input 102 (LClk_p) of precharging transistor 108 is a more desired time measurement. It will also be appreciated, that there is no equivalent setup time test for non-SOI technologies without an evaluate device. However, according to the principles of the present invention such setup time test is now made possible for non-SOI technologies.

Figure 6A:
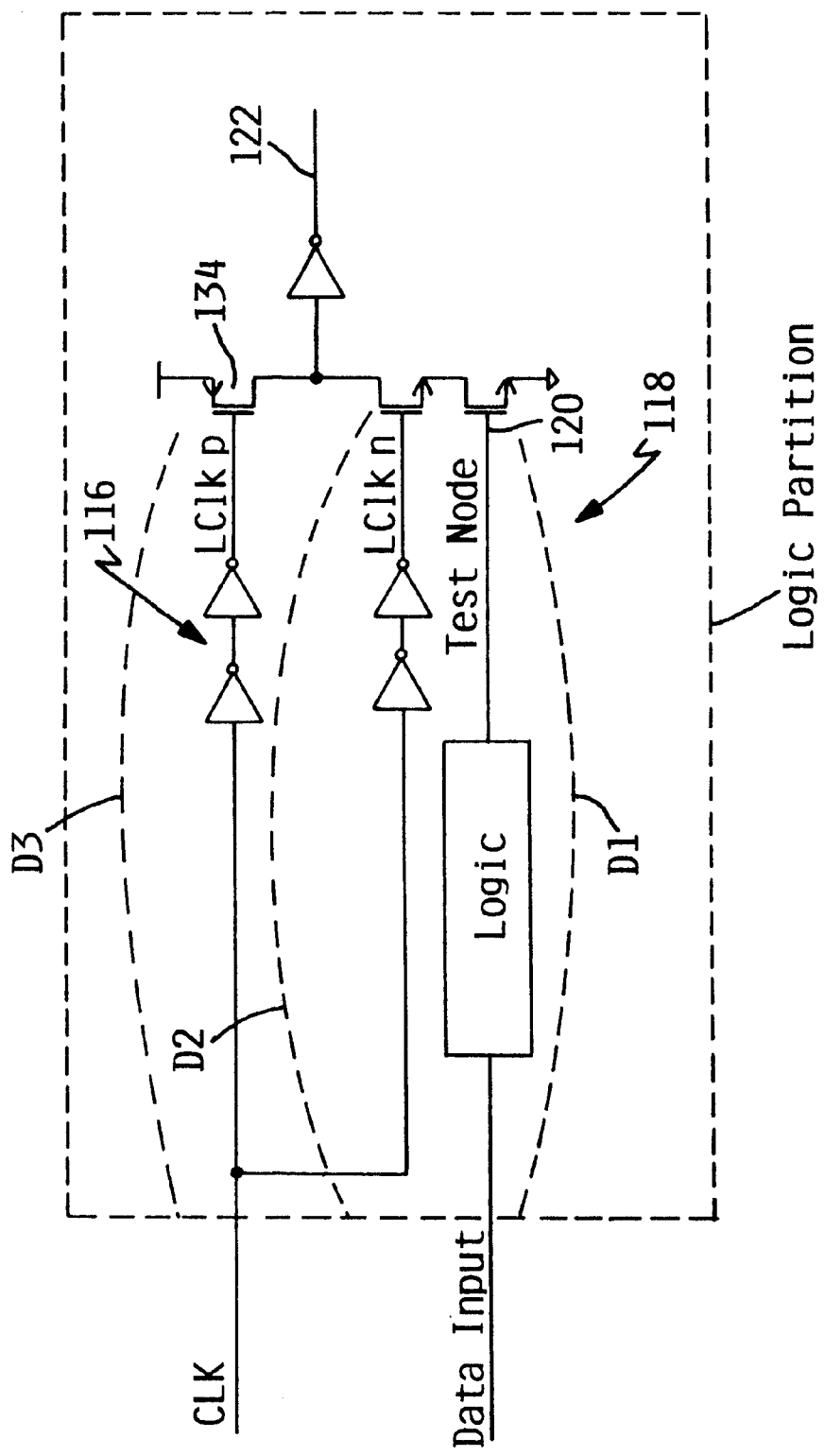
FIGS. 6A–B is a diagram of signal timing relationships between the clock, data input, test node, LClk p and LClk n signals in a SOI CMOS dynamic logic circuit.

Referring now to FIG. 6A, a schematic illustrating a method and apparatus for measuring data setup time is illustrated, including an SOT CMOS dynamic logic circuit, data signal time delay D1, clock signal time delays D2 and D3. Clock signal (Clk) time delay D3 is defined according to the principles of the present invention, while D2 illustrates the clock time delay that is well known in the art.

Figure 6B:
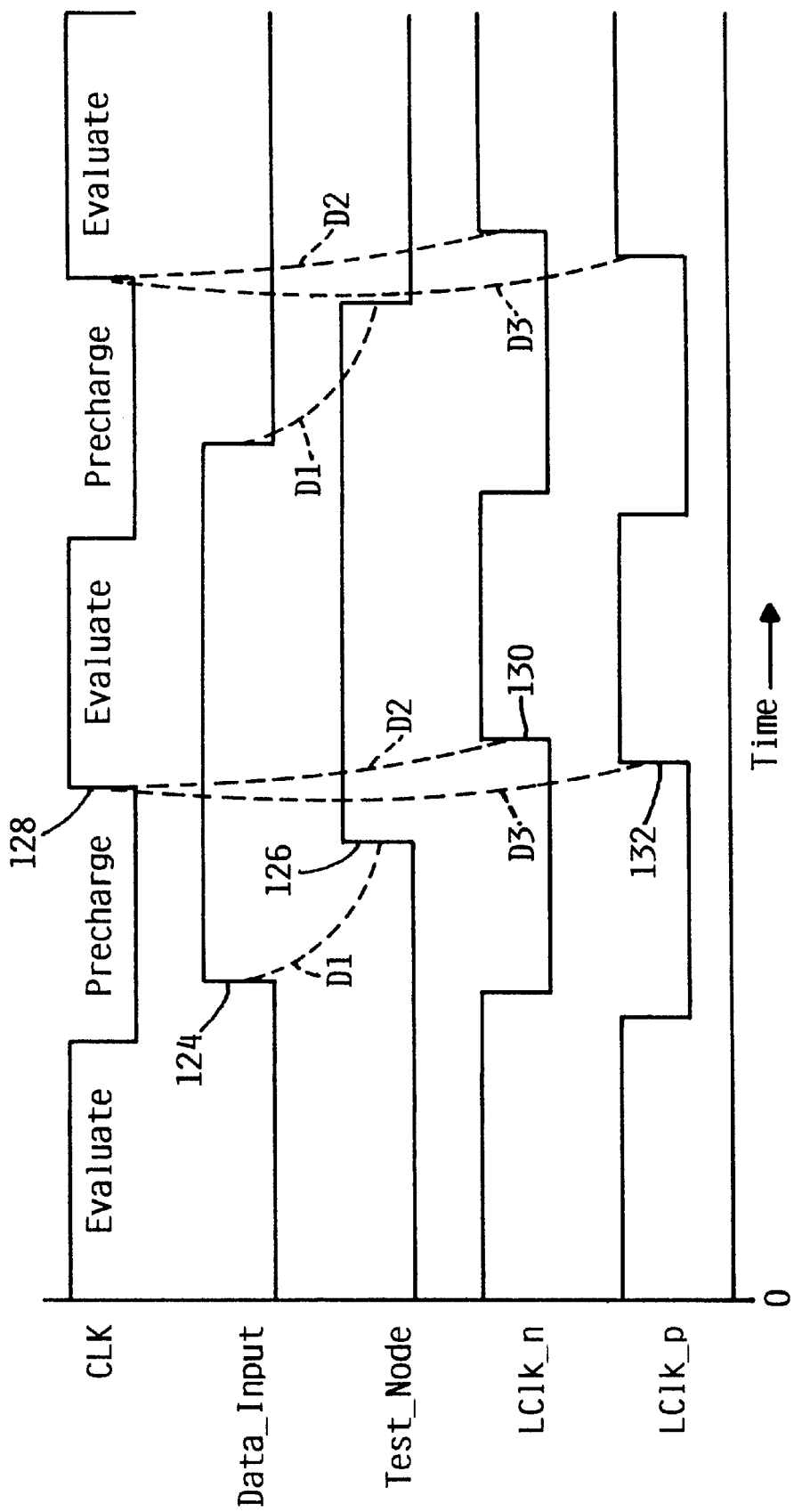

FIG. 6B illustrates the signal wave form timing relationship between the clock signal (Clk), data signal, (Data Input), and signals at circuit nodes Test Node, Lclk_p, and LClk_n along respective clock and data signal paths corresponding to time delays D1, D2, and D3.

Time delay D1 is determined by taking the difference between the rising edge of Data_Input signal 124 and the rising edge of Test_Node signal 126. Time delay D2 is determined by taking the difference between the rising edge of LClk_n signal 130 and the rising edge of the CLK signal 128. Likewise, time delay D3 is determined by taking the difference between the rising edge of LClk_p signal 132 and the rising edge of the CLK signal 128. Those skilled in the art will appreciate that when the setup time, SETUP, is determined based on the the difference between time delays D3 and D1, "SETUP=D1−D3," the precharging transistor 134 (FIG. 6A) continues its precharging function for a time period equal to SETUP, thus guaranteeing that the logic input at Test_Node 118 (FIG. 6A) is stable prior to a subsequent rising clock signal edge 128.

As described above and as shown at TABLE 1, the setup equation that is well known in the art: "SETUP=D1−D2;" whereas the setup equation according to the principles of the present invention is shown at TABLE 2: "SETUP=D1−D3."

Although clock signal paths corresponding to time delays D2 and D3 appear to be similar, in real world applications they will differ. This generally occurs in applications where the clocks are gated. Likewise, the clock signal paths may differ in applications where the clocks are arranged in arrays where more logic blocks, such as inverters 116, can appear in the different clock paths. Because logic blocks may appear in the direct path of the clock signals the setup equation according to the principles of the present invention should be used to guarantee output data stability prior to removing the precharging action by turning off the corresponding precharging transistor of the dynamic logic circuit 134 (FIG. 6A). Accordingly, the appropriate SETUP equation must be taken relative to time delay D3 rather than time delay D2, as illustrated at TABLES 2 and 3.

It will be appreciated by those skilled in the art that digital signals require some delay to change from a logic low state to a logic high state, and accordingly, from a logic high to a logic low state. The amplitude change of the logic signal during such transitions is referred to as the signal swing. In dynamic circuits that do not utilize SOI technologies, the data path D1, is typically measured within 50% to 75% of its swing at Test_Node 120 (FIG. 6A). It will be appreciated that in dynamic logic circuits utilizing SOI technology, the Test_Node 120 (FIG. 6A.)must be stable before the precharging transistor turns off. Accordingly, the data path should be measured to within 90% of its swing.

The present invention has been described in its presently contemplated best mode, and it is clear that it is susceptible to various modifications, modes of operation and embodiments, all within the ability and skill of those skilled in the art and without the exercise of further inventive activity. Further, while the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. A method of eliminating the effects of parasitic bipolar transistor action by measuring a setup time in a logic partition of a dynamic logic circuit including Silicon on Insulator (SOI) Metal Oxide Semiconductor (MOS) devices, having a precharging device and an output device, the method comprising:

determining a first time delay of a first signal from said logic partition to a control input of said precharging device;

determining a second time delay of a second signal from said logic partition to a control input of said output device; and determining a setup time according to said first and second time delays; said setup time determined to substantially prevent bipolar leakage current flow within the dynamic logic circuit during an evaluate phase of the dynamic logic circuit.

2. The method according to claim 1, wherein said first signal is a clock signal.

3. The method according to claim 1, wherein said second signal is a logic data signal.

4. The method according to claim 3, wherein the logic data signal arriving at said logic partition within said determined setup time guarantees that said logic data signal is stable prior to or upon the occurrence of a subsequent clock signal.

5. The method according to claim 1, wherein said setup time is determined according to the following equation:

$$SETUP=D1-D3;$$

wherein SETUP is the setup time;
D3 is said first time delay; and
D1 is said second time delay.

6. The method according to claim 1, wherein measurement of said second time delay occurs at 90% of the signal swing of said second signal.

7. An apparatus for eliminating the effects of parasitic bipolar transistor action in a dynamic logic circuit including Silicon on Insulator (SOI) Metal Oxide Semiconductor (MOS) devices, comprising:

a first logic circuit;

a second logic circuit;

a precharging device coupled to said first logic circuit;

an output device coupled to said second logic circuit; and said precharging device coupled to said output device, defining a node therebetween;

wherein a setup time is determined according to a predetermined timing relationship between a first signal propagation time through said first logic circuit coupled to said precharging device and a second signal propagation time through said second logic circuit, said setup time determined to substantially prevent bipolar leakage current flow within the dynamic logic circuit during an evaluate phase of the dynamic logic circuit.

8. The apparatus according to claim 7, wherein said first signal is a clock signal.

9. The apparatus according to claim 7, wherein said second signal is a logic data signal.

10. The apparatus according to claim 7, wherein said precharging device is a PFET transistor.

11. The apparatus according to claim 7, wherein said output device is an NFET transistor.

12. The apparatus according to claim 7 wherein said predetermined timing relationship is the difference between said first and second propagation times.

13. The apparatus according to claim 12 wherein a signal applied to said output device within a predetermined time according to said predetermined timing relationship is stable prior to said precharging device turning off.

14. The apparatus according to claim 12, wherein said predetermined timing relationship is a setup time determined according to the following equation:

$$SETUP=D1-D3;$$

wherein SETUP is the setup time;
D3 is said first signal propagation time; and
D1 is said second signal propagation time.

15. The apparatus according to claim 14, wherein said first signal is a clock signal.

16. The apparatus according to claim 14 wherein said second signal is a logic data signal.

* * * * *